(12) United States Patent
Streubel et al.

(10) Patent No.: US 7,989,830 B2
(45) Date of Patent: Aug. 2, 2011

(54) OPTOELECTRONIC THIN-FILM CHIP

(75) Inventors: Klaus Streubel, Laaber (DE); Ralph Wirth, Mintraching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 702 days.

(21) Appl. No.: 11/663,941

(22) PCT Filed: Sep. 27, 2005

(86) PCT No.: PCT/DE2005/001711
§ 371 (c)(1),
(2), (4) Date: Jun. 30, 2008

(87) PCT Pub. No.: WO2006/034694
PCT Pub. Date: Apr. 6, 2006

(65) Prior Publication Data
US 2008/0283855 A1    Nov. 20, 2008

(30) Foreign Application Priority Data
Sep. 27, 2004   (DE) .................... 10 2004 046 792

(51) Int. Cl.
*H01L 27/14* (2006.01)
*H01L 31/00* (2006.01)

(52) U.S. Cl. ............ 257/98; 257/88; 257/431; 257/432; 257/E33.067; 257/E33.068

(58) Field of Classification Search ............... 257/88–98, 257/E33.067, E33.068, 431, 432; 438/29
See application file for complete search history.

(56) References Cited

U.S. PATENT DOCUMENTS
2002/0017652 A1   2/2002   Illek et al.
2006/0138439 A1*  6/2006   Bogner et al. .................. 257/98

FOREIGN PATENT DOCUMENTS
EP    1 221 725 A1   1/2002
JP    61-19181       1/1986

OTHER PUBLICATIONS

"Preparation and Properties of Monolithically Integrated Lenses on InGaAsP/InP Light-Emitting Diodes", Electronics Letters, vol. 18, No. 19, pp. 831-832, 1982.
I. Schnitzer et al., "30% external quantum efficiency from surface textured, thin-film light-emitting diodes", Appl. Physics Letters, vol. 63, No. 18, pp. 2174-2176, Oct. 18, 1993.

* cited by examiner

*Primary Examiner* — Cuong Q Nguyen
*Assistant Examiner* — Cathy N Lam
(74) *Attorney, Agent, or Firm* — Cohen Pontani Lieberman & Pavane LLP

(57) ABSTRACT

An optoelectronic thin-film chip is specified, comprising at least one radiation-emitting region (8) in an active zone (7) of a thin-film layer (2) and a lens (10, 12) disposed downstream of the radiation-emitting region (8). The lens is formed by at least one partial region of the thin-film layer (2), the lateral extent ($\Phi$) of the lens (10, 12) being greater than the lateral extent of the radiation-emitting region ($\delta$). A method for producing such an optoelectronic thin-film chip is furthermore specified.

11 Claims, 6 Drawing Sheets

| r [μm] | d [μm] | η | NA |
|---|---|---|---|
| ∞ | 0.0 | 16.9% | 30.0% |
| 100 | 1.6 | 18.7% | 26.2% |
| 50 | 3.4 | 22.5% | 25.7% |
| 30 | 6.0 | 25.0% | 24.7% |
| 25 | 7.7 | 26.9% | 23.3% |
| 20 | 11.3 | 30.3% | 22.3% |
| 18 | 18.0 | 27.0% | 25.4% |

| h [μm] | η | NA |
|---|---|---|
| 2 | 24.8% | 24.3% |
| 4 | 25.9% | 23.7% |
| 6 | 26.6% | 23.2% |
| 8 | 27.0% | 23.7% |
| 10 | 27.8% | 26.6% |
| 12 | 26.1% | 27.1% |
| 14 | 26.4% | 25.9% |
| 20 | 24.6% | 27.7% |
| 28 | 20.4% | 37.4% |
| 36 | 17.6% | 38.8% |

OPTOELECTRONIC THIN-FILM CHIP

RELATED APPLICATIONS

This is a U.S. national stage of application No. PCT/DE2005/001711, filed on Sep. 27, 2005.

This patent application claims the priority of German patent application no. 10 2004 046 792.7 filed Sep. 27, 2004, the disclosure content of which is hereby incorporated by reference.

FIELD OF THE INVENTION

The invention relates to an optoelectronic thin-film chip and to a method for producing an optoelectronic thin-film chip.

BACKGROUND OF THE INVENTION

The document I. Schnitzer et al., Appl. Phys. Lett. 63(16), Oct. 18, 1993, pages 2174 to 2176, describes the basic principle of a thin-film light-emitting diode chip. The disclosure content of this document relating to the basic principle of thin-film light-emitting diode chips is hereby incorporated by reference.

U.S. Published Patent Application No. 2001/0017652 describes a semiconductor chip comprising a thin-film layer. A photon-emitting active zone is formed in the thin-film layer. A carrier is arranged on a surface remote from the emission direction of the thin-film chip.

SUMMARY OF THE INVENTION

It is an object of the present invention to specify a thin-film chip having improved light coupling-out properties. It is furthermore an object of the present invention to specify a method for producing such a thin-film chip.

In accordance with at least one embodiment of the optoelectronic thin-film chip, the thin-film chip has a thin-film layer.

The thin-film layer is provided for example by a layer sequence which is deposited epitaxially on a growth substrate and from which the growth substrate is at least partly removed. That is to say that the thickness of the substrate is reduced. In other words, the substrate is thinned. It is furthermore possible for the entire growth substrate to be removed from the thin-film layer.

Preferably, the thin-film layer has at least one active zone suitable for generating electromagnetic radiation. The active zone may be provided for example by a layer or layer sequence which has a pn junction, a double heterostructure, a single quantum well structure or a multiple quantum well structure.

Particularly preferably, the active zone has at least one radiation-emitting region. In this case, the radiation-emitting region is formed for example by a partial region of the active zone. Electromagnetic radiation is generated in said partial region of the active zone during operation of the optoelectronic thin-film chip.

In accordance with at least one embodiment of the thin-film chip, a lens is disposed downstream of the radiation-emitting region. In this case, lens should be understood to mean, for example, an optical element suitable for refracting electromagnetic radiation that passes through the optical element. However, it is also possible for the lens to be suitable for diffracting electromagnetic radiation. Furthermore, it is possible for the lens to be suitable both for refracting light and for diffracting light. Preferably, the lens is disposed downstream of the radiation-emitting region in such a way that at least one portion of the electromagnetic radiation generated in the radiation-emitting region passes through the lens and is refracted and/or diffracted by the latter.

The lens is preferably formed by at least one partial region of the thin-film layer. That is to say that at least one partial region of the thin-film layer is structured in such a way that it is suitable for refracting and/or diffracting electromagnetic radiation generated in the radiation-emitting region. By way of example, the lens may be formed by a structured partial region of a surface of the thin-film chip. In this case, the area of the thin-film chip preferably has the lens that originally faced the growth substrate. The structured partial region of the thin-film layer surface may have a defined curvature, for example. The lens may then be delimited by this part of the surface, for example. Electromagnetic radiation that passes through the curved partial region of the surface from the thin-film layer is then refracted for example according to the laws of geometrical optics.

Particularly preferably, the lateral extent of the lens is greater than the lateral extent of the radiation-emitting region. In this case, lateral extent of the lens should be understood to mean, for example, the maximum extension of the lens in a plane perpendicular to the growth direction of the epitaxial layer sequence. Accordingly, the lateral extent of the radiation-emitting region then denotes the maximum extension of the radiation-emitting region in a plane perpendicular to the growth direction of the epitaxial layer sequence.

In accordance with at least one embodiment of the optoelectronic thin-film chip, therefore, an optoelectronic thin-film chip is specified which has at least one radiation-emitting region in an active zone of a thin-film layer. In this case, a lens is disposed downstream of the radiation-emitting region, said lens being formed by at least one partial region of the thin-film layer, and the lateral extent of said lens being greater than the lateral extent of the radiation-emitting region.

In at least one embodiment of the optoelectronic thin-film chip, the optoelectronic thin-film chip has a plurality of radiation-emitting regions. That is to say that, for example, a plurality of partial regions of the active zone of the thin-film layer emit electromagnetic radiation during operation of the optoelectronic thin-film chip. The radiation-emitting regions may be arranged for example in a regular pattern at substantially identical distances with respect to one another in the active zone. Preferably, all the radiation-emitting regions are substantially of the same size in this case, that is to say that all the radiation-emitting regions have, for example, substantially the same lateral extent.

In this case, substantially the same lateral extent means that due to the dictates of production or on account of undesired inhomogeneities in the thin-film layer, fluctuations in the extent and arrangement of the radiation-emitting regions are possible.

Furthermore, preferably precisely one lens is disposed downstream of each radiation-emitting region. That is to say that preferably one lens is unambiguously assigned to each radiation-emitting region. The proportion of the electromagnetic radiation generated by the radiation-emitting regions which passes through a lens is then generated for the most part in the radiation-emitting region assigned to the lens. For the most part in the radiation-emitting region assigned to the lens should be understood to mean, for example, that electromagnetic radiation from other, for example adjacent, radiation-emitting regions can also pass through said lens. However, the greatest proportion of electromagnetic radiation that passes through the lens originates from the radiation-emitting region assigned thereto.

Preferably, a thin-film chip has at least eighty radiation-emitting regions. Accordingly, a thin-film chip preferably has at least eighty lenses disposed downstream of the radiation-emitting regions.

In accordance with at least one embodiment of the optoelectronic thin-film chip, the thin-film chip has a carrier, to which the thin-film layer is applied. In this case, the carrier is preferably applied to that surface of the thin-film layer which is remote from the original growth substrate. Compared with a growth substrate, the carrier can be chosen relatively freely in this case. Thus, the carrier may be more suitable with regard to some properties such as, for instance, conductivity or stability for the device than available growth substrates that are subject to narrow restrictions for producing high-quality layer sequences grown epitaxially. Thus, in order to obtain high-quality epitaxial layers, the epitaxially deposited material has to be lattice-matched to the growth substrate, by way of example.

Preferably, the carrier applied to the thin-film layer is distinguished by a coefficient of thermal expansion adapted to the thin-film layer. By way of example, the carrier may contain a semiconductor material such as germanium, gallium arsenide, gallium nitride, silicon carbide and other materials such as sapphire, molybdenum, metals or carbon.

Furthermore, the carrier is preferably distinguished by a particularly good thermal conductivity, with the result that the heat arising during the generation of electromagnetic radiation in the active zone of the thin-film layer can be at least partly emitted to the surroundings via the carrier.

In accordance with at least one embodiment of the thin-film chip, a mirror layer is arranged between the carrier and the thin-film layer. The mirror layer may comprise for example a Bragg mirror or a metal-containing mirror layer. A metal-containing mirror, which may contain for example gold, gold-germanium, silver, aluminum or platinum, is distinguished by a lower directional dependence of the reflectivity, for example, compared with a Bragg mirror. Moreover, it is possible to achieve a higher reflectivity with metal-containing mirrors than with Bragg mirrors.

Particularly preferably, the reflective metal layer arranged between carrier and thin-film layer is suitable for reflecting the electromagnetic radiation generated by the radiation-emitting region, whereby the radiation efficiency of the thin-film chip is increased.

In accordance with at least one embodiment of the optoelectronic thin-film chip, the thin-film chip has at least one current coupling-in region. The current coupling-in region is preferably arranged between carrier and thin-film layer. By means of the current coupling-in region, electric current can be coupled into the thin-film layer, where it is utilized in the active zone for generating electromagnetic radiation. By way of example, the current coupling-in region may be formed by a contact area by means of which the thin-film layer can be electrically contact-connected from the carrier.

If the thin-film layer has a particularly low electrical conductivity for example in a plane parallel to the interface of carrier and thin-film layer, that is to say if the transverse conductivity of the thin-film layer is particularly low, then the lateral extent of the current coupling-in region substantially predetermines the lateral extent of the radiation-emitting region in the active zone of the thin-film layer. That is to say that the lateral extent of the current coupling-in region substantially corresponds to the lateral extent of the radiation-emitting region. In this case, substantially means that deviations can occur on account of, for example, fluctuations in the transverse conductivity of the thin-film layer.

Particularly preferably, the lateral extent of the lens is greater than the lateral extent of the radiation coupling-in region and hence greater than the lateral extent of the radiation-emitting region.

In accordance with at least one embodiment of the optoelectronic thin-film chip, the thin-film chip has a plurality of such current coupling-in regions. Preferably, a lens is assigned to each current coupling-in region one-to-one. Current coupling-in region, radiation-emitting region and lens are arranged for example along a straight line that is perpendicular to the interface of carrier and thin-film layer, that is to say runs substantially parallel to the growth direction of the thin-film layer.

It is furthermore conceivable for the electromagnetic radiation to be generated in the radiation-emitting regions for example by optical and not by electrical excitation.

Particularly preferably, the lens is formed at the surface of the thin-film chip which is remote from the carrier. That is to say that the lens is preferably formed by the structuring of a part of said surface. By way of example, the part of the surface may in this case form a spherical or aspherical outwardly curved volume lens. However, it is also possible for the structured part of the thin-film layer surface to form a Fresnel lens.

In accordance with at least one embodiment of the optoelectronic thin-film chip, the lateral extent of the lens is between 30 and 100 µm. In this case, lateral extent of the lens should be understood to mean, for example, the diameter of the lens at the base point of the lens. In this case, the base point of the lens lies for example in the plane of the surface of the thin-film chip in which the lens is formed.

Preferably, the lateral extent of the lens is between 30 and 60 µm. The height of the lens, that is to say the distance from the base point of the lens to the vertex of the lens is, for example, between 1 and 50 µm, preferably between 1 and 20 µm.

In at least one embodiment of the thin-film chip, the lateral extent of the current coupling-in region is between 1 and 80 µm, preferably between 10 and 40 µm. In the case where the thin-film layer has only low transverse conductivity, the lateral extent of the current coupling-in region substantially corresponds to the lateral extent of the radiation-generating region.

In accordance with at least one embodiment of the optoelectronic thin-film chip, the distance between the radiation-emitting region and the base point of the lens is between 1 and 50 µm.

If the coupling-out efficiency for coupling out electromagnetic radiation from the thin-film chip is intended to be optimized by means of the lens, by way of example, then the distance between radiation-emitting region and base point of the lens is preferably between 1 and 25 µm, particularly preferably between 1 and 10 µm. If it is intended, for instance, to concentrate a particularly large proportion of the coupled-out electromagnetic radiation in a direction for example perpendicularly to the surface of the thin-film layer on which the lens is formed, then the distance between radiation-emitting region and base point of the lens is preferably between 25 and 50 µm, particularly preferably between 25 and 40 µm. The radiation passing through the lens is then at least partly concentrated into a beam cone around this direction.

In at least one embodiment of the optoelectronic thin-film chip, the thin-film layer has at least one depression at the interface between thin-film layer and carrier. Preferably, the depression at least partly surrounds the current coupling-in region. Particularly preferably, the depression completely surrounds the current coupling-in region. That is to say that if, proceeding from a current coupling-in region, one sweeps over the thin-film layer at the interface of thin-film layer and carrier, then one arrives at the depression preferably in each direction which lies in the plane of said interface. By way of example, the depression surrounds precisely one current coupling-in region. Preferably, each current coupling-in region is surrounded by at least one depression. In this case, the depression may be arranged in ring-shaped fashion, for example, around the current coupling-in region.

In accordance with at least one embodiment of the thin-film chip, the depth of the depression is between 1 and 20 µm. That is to say that the depression is between 1 and 20 µm deep at its deepest location. Particularly preferably, the depression is between 1 and 8 µm deep. By way of example, the depression can reach as far as the beginning of the active zone of the thin-film layer, as viewed from the carrier. By way of example, the depression does not cut through the active zone of the thin-film layer in this case. However, it is also possible for the depression to reach into the thin-film layer so far that it cuts through the active zone.

In accordance with at least one embodiment of the optoelectronic thin-film chip, the depression tapers in the direction of the surface of the thin-film layer which is remote from the carrier. By way of example, the depression has planar inner walls in this case. The inner walls of the depression are for example disposed downstream of the current coupling-in region in a direction away from the carrier. Preferably, the inner walls form an angle of between 10 and 90 degrees with the carrier. Particularly preferably, said angle is between 10 and 80 degrees.

A method for producing an optoelectronic thin-film chip is furthermore specified.

In accordance with at least one embodiment of the method, firstly a thin-film layer is deposited epitaxially onto a growth substrate. The thin-film layer is an epitaxially grown layer sequence, for example. The thin-film layer preferably contains at least one layer or layer sequence which is suitable as an active zone for generating electromagnetic radiation.

Preferably, a dielectric layer is deposited onto the surface of the thin-film layer which is remote from the growth substrate, in which dielectric layer at least one current coupling-in region is subsequently formed in the form of a recess in the dielectric layer. A multiplicity of radiation coupling-in regions are preferably formed.

In a subsequent method step, a metal layer, for example, may be applied to the surface of the thin-film layer which is remote from the carrier, for example to the dielectric layer, said metal layer being suitable for reflecting electromagnetic radiation generated in the active zone.

A carrier is subsequently applied to the surface of the thin-film layer which is remote from the growth substrate. The carrier may be fixed on the thin-film layer by means of a soldering method, by way of example.

In a further method step, the growth substrate is then at least partly removed from the thin-film layer. That is to say that, for example, the growth substrate is thinned or removed from the thin-film layer.

In accordance with at least one embodiment of the method, at least one lens is produced on the surface of the thin-film layer which is remote from the carrier. Preferably, the lens is disposed downstream of a current coupling-in region. Particularly preferably, in the case of a plurality of current coupling-in regions, precisely one lens is disposed downstream of each current coupling-in region.

In accordance with at least one embodiment of the method for producing an optoelectronic thin-film chip, the lens is produced by means of at least one etching process. In this way, spherical, aspherical or Fresnel lenses, for example, can be produced on the surface of the thin-film layer which is remote from the carrier.

BRIEF DESCRIPTION OF THE DRAWINGS

The optoelectronic thin-film chip described here is explained in more detail below on the basis of exemplary embodiments and the associated figures.

DETAILED DESCRIPTION OF THE DRAWINGS

In the exemplary embodiments and figures, identical or identically acting constituent parts are in each case provided with the same reference numbers. The elements illustrated in the figures are not to be regarded as true to scale. Rather, in order to afford a better understanding, individual elements in the figures may be illustrated in part with an exaggerated size and not in the actual size relation with respect to one another.

Figure 1:
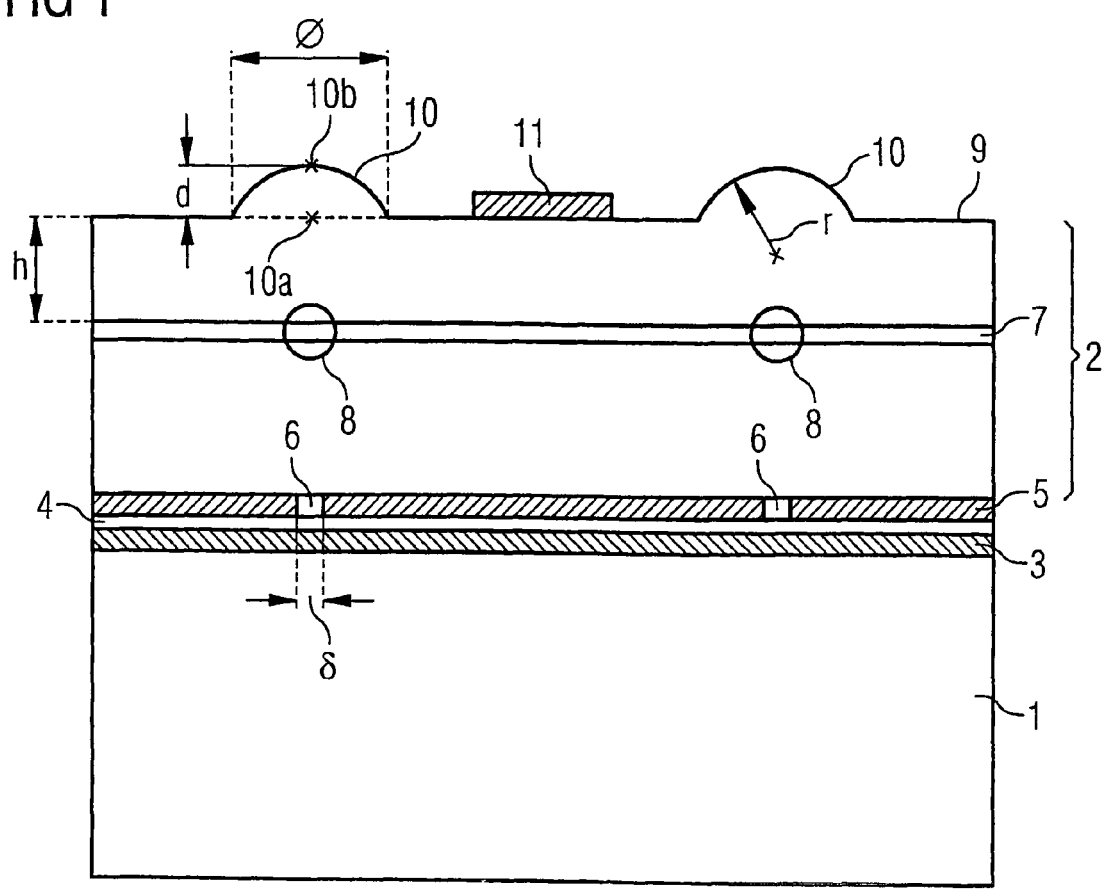
FIG. 1 shows a schematic sectional illustration of a first exemplary embodiment of the thin-film chip.

FIG. 1 shows a schematic sectional illustration of a first exemplary embodiment of the optoelectronic thin-film chip described here.

In this exemplary embodiment, a thin-film layer 2 is arranged on the carrier 1. The carrier 1 is provided by a wafer, by way of example. By way of example, the carrier may contain at least one of the following materials: germanium, gallium arsenide, gallium nitride, silicon carbide, sapphire, molybdenum, metals, carbon.

However, it is also possible for the carrier 1 to be formed by a flexible electrically conductive film. By way of example, the carrier may be provided by a carbon film. In this case, the thickness of the film is preferably less than or equal to 100 µm.

The carrier is connected to the thin-film layer 2 by means of a solder layer 3, by way of example. By way of example, an electrically insulating dielectric layer 5 is applied to the interface of the thin-film layer 2 which faces the carrier.

The dielectric layer 5 is succeeded by a reflective metal layer 4 containing, by way of example, a reflective metal such as gold, silver, gold-germanium, aluminum or platinum.

The reflective metal layer 4 preferably has particularly good electrical conductivity, on the one hand, and is suitable, on the other hand, for reflecting the electromagnetic radiation generated in the radiation-emitting regions 8 of the thin-film layer 2 at least partly in the direction of the surface 9 of the thin-film layer 2. The surface 9 is the surface which is remote from the carrier 1 and which originally faced the removed growth substrate.

The dielectric layer 5 has perforations which form the current coupling-in regions 6. In this case, the perforations contain for example the material of the reflective metal layer 5. The current coupling-in regions 6 have a lateral extent δ, by way of example. They may be formed in cylindrical fashion, by way of example. The lateral extent δ is then given by the diameter of said cylinder.

The thin-film layer 2 is based for example on phosphide compound semiconductor materials or on nitride compound semiconductor materials.

In this context, "based on phosphide compound semiconductors" means that a component or part of a component designated in this way preferably comprises $Al_nGa_mIn_{1-n-m}P$, where $0 \leq n \leq 1$, $0 \leq m \leq 1$ and $n+m \leq 1$. In this case, this material need not necessarily have a mathematically exact composition according to the above formula. Rather, it may have one or more dopants and additional constituents that do not substantially change the physical properties of the material. For the sake of simplicity, however, the above formula only comprises the essential constituents of the crystal lattice (Al, Ga, In, P) even though they may be replaced in part by small quantities of further substances.

In the present context, "based on nitride compound semiconductors" means that the active epitaxial layer sequence or at least one layer thereof comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it may have one or more dopants and additional constituents that do not substantially change the characteristic physical properties of the $Al_nGa_mIn_{1-n-m}N$ material. For the sake of simplicity, however, the above formula only comprises the essential constituents of the crystal lattice (Al, Ga, In, N) even though they may be replaced in part by small quantities of further substances.

In this case, this should be understood such that the thin-film layer contains at least one individual layer which contains a material from the respective compound semiconductor material systems.

The thin-film layer 2 furthermore preferably has at least one active zone 7 which is suitable for generating electromagnetic radiation. The active zone 7 may have, by way of example, a pn junction, a double heterostructure, a single quantum well structure or a multiple quantum well structure.

In the context of the application, the designation quantum well structure encompasses any structure in which charge carriers experience a quantization of their energy states as a result of confinement. In particular, the designation quantum well structure does not comprise any indication about the dimensionality of the quantization. It thus encompasses, inter alia, quantum wells, quantum wires and quantum dots and any combination of these structures.

If current is coupled into the thin-film layer 2 through the current coupling-in regions 6, then, owing to the low transverse conductivity of the materials used for the thin-film layer 2, current flows substantially perpendicular to the carrier 1 to the active zone 7. Where the active zone 7 is energized with current, radiation-emitting regions 8 arise. In this case, owing to the low transverse conductivity of the material of the thin-film layer 2, the lateral extent of the radiation-emitting regions 8 is substantially given by the lateral extent of the current coupling-in regions 6.

A lens 10 is disposed downstream of each radiation-emitting region 8 at a distance h between active zone 7 and surface 9. The lens 10 is a volume lens, by way of example. It may be spherically or aspherically outwardly curved, by way of example. The lens is characterized by its thickness d, which specifies the distance between base point 10a of the lens and vertex 10b of the lens. If a spherical lens 10 is involved, for example, then the curvature of the lens 10 is determined by the lens radius r. The lens is furthermore characterized by its lateral extent Φ at the base point 10a of the lens 10. In this case, the base point 10a of the lens 10 lies for example in the plane of the surface 9 of the thin-film layer 2. That is to say that the distance h describes the distance between radiation-emitting region 8 and base point 10a of the lens disposed downstream of the radiation-emitting region 8. Electromagnetic radiation generated in the radiation-emitting region 8 emerges from the thin-film layer 2 for example through the lens 10 disposed downstream of the radiation-emitting region 8. Particularly preferably, the lenses 10 are formed by means of at least one etching process in the surface 9 of the thin-film layer 2.

Furthermore, a bond pad 11 is applied on the surface 9, said bond pad comprising an electrically conductive material, for example, and serving for making electrical contact with the thin-film chip. The bond pad 11 is preferably applied in such a way that the radiation-emitting regions 8 are not concealed by the bond pad 11.

Figure 2:
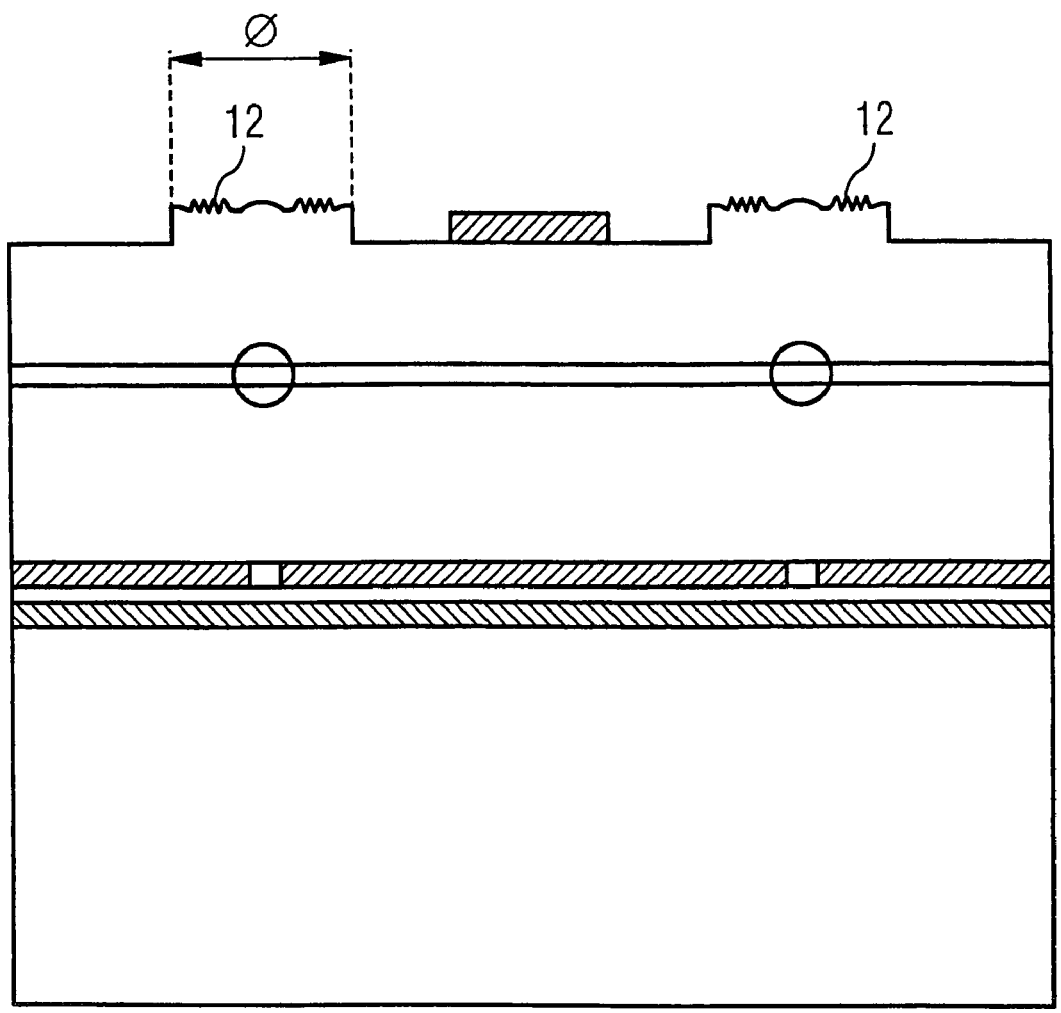
FIG. 2 shows a schematic sectional illustration of a second exemplary embodiment of the thin-film chip.

FIG. 2 shows, in contrast to FIG. 1, that the lens may also be provided by a Fresnel lens 12. The Fresnel lens 12 is preferably patterned into the surface 9 of the thin-film layer 2 by means of at least one etching process.

Figure 3:
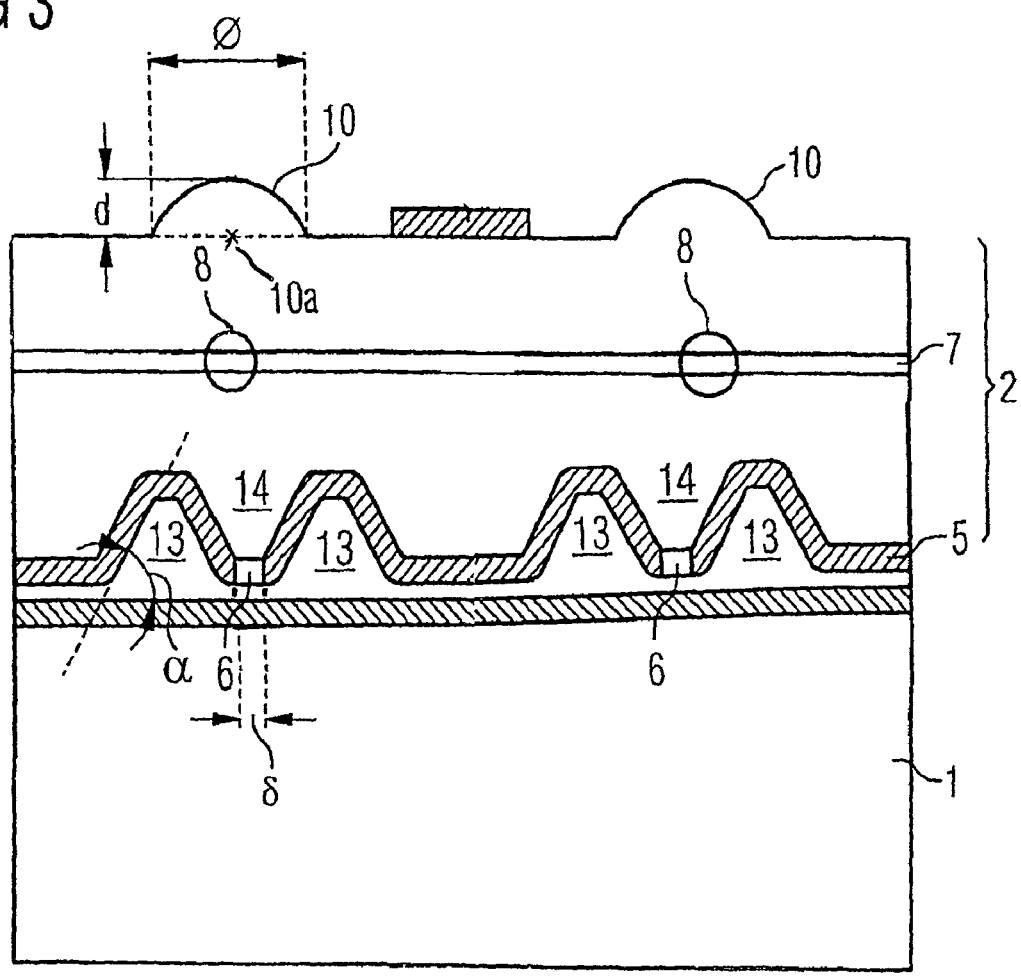
FIG. 3 shows a schematic sectional illustration of a third exemplary embodiment of the thin-film chip.
Figure 4:
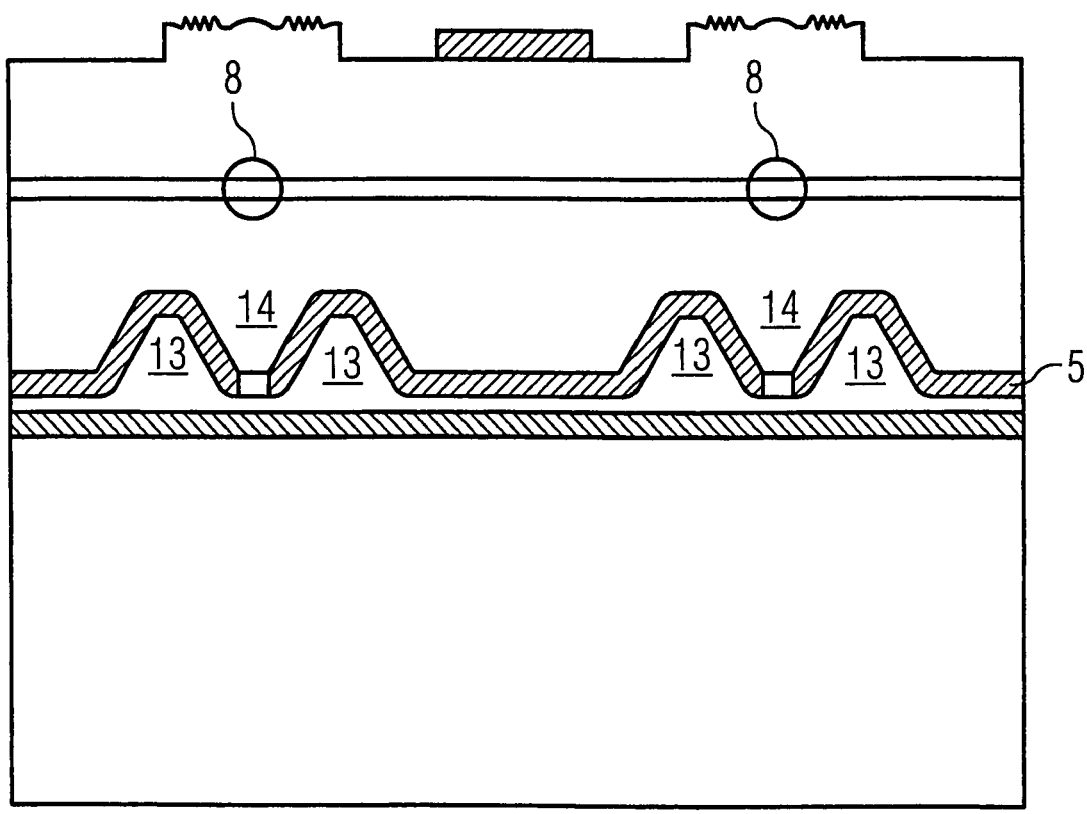
FIG. 4 shows a schematic sectional illustration of a fourth exemplary embodiment of the thin-film chip.

FIGS. 3 and 4 show, in contrast to FIGS. 1 and 2, exemplary embodiments of the surface emitting thin-film chip in which depressions 13 are introduced into the interface between thin-film layer 2 and carrier 1. In this case, each radiation coupling-in region 6 is preferably surrounded by at least one depression 13. By way of example, the depression 13 may be arranged in ring-shaped fashion around the current coupling-in region 6. The depressions 13 may extend as far as the active zone 7, by way of example. The depressions 13 preferably have inner walls which run in planar fashion and which form an angle α with a plane parallel to the interface of carrier 1 and thin-film layer 2.

The inner walls of the depression 13 are preferably covered with the dielectric layer 5 and the reflective layer 4. They are therefore at least partly reflective to the electromagnetic radiation generated in the radiation-emitting regions 8.

The depressions 13 define mesa structures 14, at the base point of which a current coupling-in region 6 is in each case arranged.

Figures 5A, 5B:
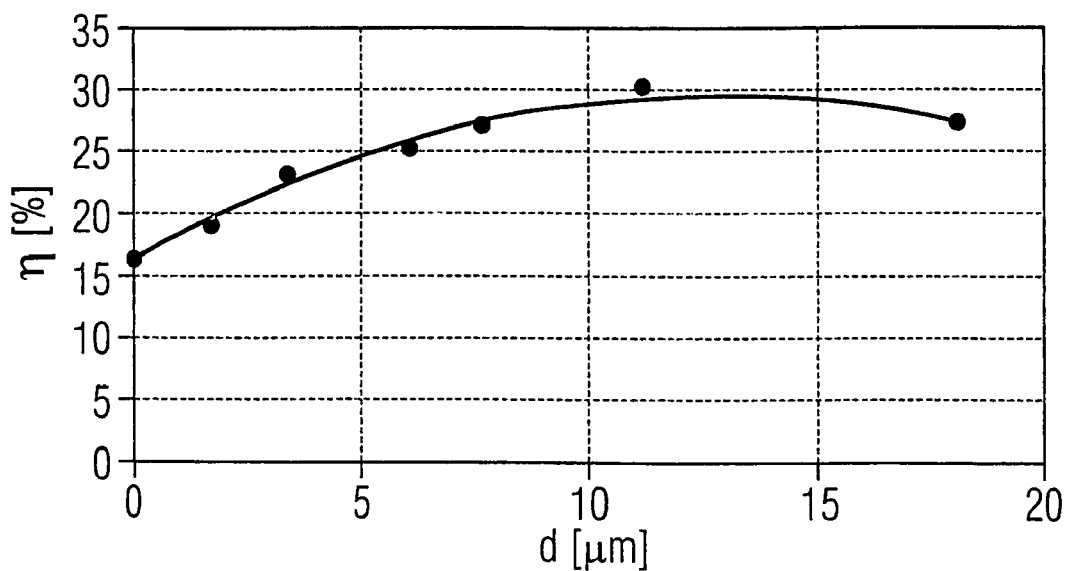
FIG. 5a shows a table with calculated values of the coupling-out efficiency of the thin-film chip for various values of the lens thickness for one exemplary embodiment of the thin-film chip.
FIG. 5b shows a graphical plotting of the coupling-out efficiency against the lens thickness for one exemplary embodiment of the thin-film chip.

FIG. 5a shows a table with calculation results. The calculations were carried out by way of example for an active zone 7 of a thin-film chip in the phosphide compound semiconductor material system. In this case, the active zone 7 has a thickness of 0.6 μm with an absorption of 0.9/μm and has an internal efficiency of 0.4. The lateral extent of the current coupling-in region is 26 μm, for example. The distance h between active zone 7 and base point 10a of the lens is set to 4 μm in these calculations. The calculations are carried out for an exemplary embodiment with a depression 13 that is 3 μm deep. In this case, the inner walls of the depression 13 form an angle α of 30 degrees with the plane of the interface of thin-film layer 2 and carrier 1. The calculations are carried out for a spherical volume lens 10, the diameter of the lens at the base point being fixed at Φ equal to 36 μm. The radius r and hence the thickness d of the lens 10 are subsequently varied. The coupling-out efficiency η, that is to say the proportion of the electromagnetic radiation which leaves the thin-film layer, and also the percentage of the radiation NA which is emitted into the numerical aperture 0.5 are calculated depending on the radius r of the lens 10.

As shown in FIG. 5b, as a function of the thickness d of the lens 10, a maximum coupling-out efficiency η results at d approximately 11 μm. The associated lens radius r is approximately 20 μm. That is to say that given a fixed distance h between base point 10a of the lens 10 and active zone 7, it is possible, by variation of the curvature r of the lens 10, to establish an optimum coupling-out efficiency η, which is increased approximately by 1.8-fold compared with the coupling-out efficiency η with a flat surface of the thin-film layer (r→∞).

Figures 6A, 6B:
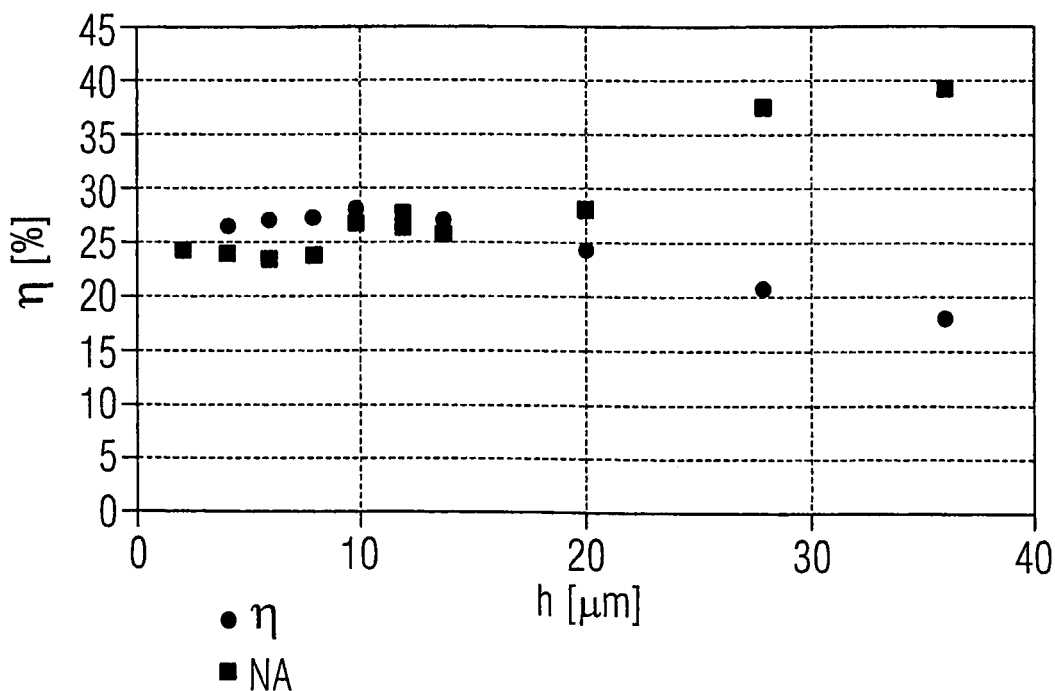
FIG. 6a shows a table with calculated values of the coupling-out efficiency as a function of the distance between the radiation-emitting region and the base point of the lens for one exemplary embodiment of the thin-film chip.
FIG. 6b shows a graphical plotting of the coupling-out efficiency against the distance between the radiation-emitting region and the base point of the lens for one exemplary embodiment of the thin-film chip.

FIG. 6a shows, with otherwise unchanged parameters, calculations with a radius r of the spherical lens 10 of approximately 30 μm, with variation of the distance h between radiation-emitting region 8 and base point 10a of the lens 10.

As shown in FIG. 6b, for example, an amplified emission into the numerical aperture 0.5 takes place at larger values of h starting from approximately 25 μm. That is to say that the emission characteristic of the thin-film chip is directional for these values of h and the emission is concentrated in a direction that is perpendicular to the surface 9 of the thin-film layer 2. The emission characteristic of the thin-film chip can therefore be established in a defined manner by variation of h.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An optoelectronic thin-film chip, comprising:
    at least one radiation-emitting region in an active zone of a thin-film layer;
    a carrier, to which the thin-film layer is applied;
    at least one current coupling-in region arranged between the carrier and the thin-film layer;
    a lens disposed on a side of the active zone opposite the carrier, said lens formed by at least one partial region of the thin-film layer, a lateral extent of the lens being greater than a lateral extent of the radiation-emitting region; and
    at least one depression in an interface of the thin-film layer which faces the carrier, wherein the at least one depression at least partly surrounds the current coupling-in region.

2. The optoelectronic thin-film chip as claimed in claim 1, comprising a plurality of radiation-emitting regions, wherein precisely one lens is disposed on a side of the active zone opposite the carrier for each radiation-emitting region.

3. The optoelectronic thin-film chip as claimed in claim 1, wherein the lateral extent of the lens is greater than a lateral extent of the current coupling-in region.

4. The optoelectronic thin-film chip as claimed in claim 1, wherein the lens is formed at a surface of the thin-film layer which is remote from the carrier.

5. The optoelectronic thin-film chip as claimed in claim 1, wherein the lateral extent of the lens is between 30 and 100 μm.

6. The optoelectronic thin-film chip as claimed in claim 1, wherein a lateral extent of the current coupling-in region is between 1 and 80 μm.

7. The optoelectronic thin-film chip as claimed in claim 1, wherein the distance between radiation-emitting region and a base point of the lens is between 1 and 50 μm.

8. The optoelectronic thin-film chip as claimed in claim 1, wherein the depression is between 1 and 20 μm deep.

9. The optoelectronic thin-film chip as claimed in claim 1, wherein the depression tapers in a direction of a surface of the thin-film layer which is remote from the carrier, and inner walls of the depression form an angle of between 10 and 90° with the carrier.

10. A method for producing a thin-film chip as claimed in claim 1, comprising:
    producing at least one lens on a surface of a thin-film layer which is remote from a carrier.

11. The method for producing a thin-film chip as claimed in claim 10, wherein the lens is produced by means of an etching process.

* * * * *